US009805782B1

(12) United States Patent
Liou

(10) Patent No.: US 9,805,782 B1
(45) Date of Patent: Oct. 31, 2017

(54) MEMORY DEVICE CAPABLE OF DETERMINING CANDIDATE WORDLINE FOR REFRESH AND CONTROL METHOD THEREOF

(71) Applicant: Elite Semiconductor Memory Technology Inc., Hsinchu (TW)

(72) Inventor: Jian-Sing Liou, Kaohsiung (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 15/422,488

(22) Filed: Feb. 2, 2017

(51) Int. Cl.
*G11C 7/00* (2006.01)
*G11C 11/403* (2006.01)
*G11C 11/408* (2006.01)

(52) U.S. Cl.
CPC ........ *G11C 11/403* (2013.01); *G11C 11/4085* (2013.01); *G11C 11/4087* (2013.01)

(58) Field of Classification Search
CPC G11C 11/403; G11C 11/4085; G11C 11/4087
USPC ....................................................... 365/222
See application file for complete search history.

(56) References Cited

U.S. PATENT DOCUMENTS

2014/0063995 A1* 3/2014 Song ................. G11C 8/14
365/200

* cited by examiner

*Primary Examiner* — Huan Hoang
(74) *Attorney, Agent, or Firm* — Winston Hsu

(57) ABSTRACT

A memory device includes an address generation circuit, an address processing circuit and a refresh control circuit. The address generation circuit generates a first intermediate address according to a row address. The first intermediate address includes a first wordline address and an identification code indicating whether a first wordline indicated by the first wordline address is a normal or redundant wordline. The address processing circuit refers to the first intermediate address to generate a second intermediate address indicating a second wordline adjacent to the first wordline. The second intermediate address includes a second wordline address and an identification code indicating whether the second wordline is a normal or redundant wordline. The refresh control circuit determines a disturbance count of the second wordline each time the first wordline is activated, and refers to the disturbance count to determine whether to output the second wordline address to refresh the second wordline.

21 Claims, 8 Drawing Sheets

| Count bits | $C_J$ $C_{J-1}$ $C_{J-2}$ ... $C_3$ $C_2$ $C_1$ $C_0$ | |
|---|---|---|
| SQ0 | $A_J$ $A_{J-1}$ $A_{J-2}$ ... $A_3$ $A_2$ $A_1$ $A_0$ | |
| add_WL$_{n+1}$ – add_WL$_{n-1}$ | 0  0  0  ... 0  0  1  0 | → 2 |
| SQ1 | $A_0$ $A_1$ $A_2$ $A_3$ ... $A_{J-2}$ $A_{J-1}$ $A_J$ | |
| add_WL$_{n+1}$ – add_WL$_{n-1}$ | 0  1  0  0  ... 0  0  0 | → 2K (J=12) |
| SQ2 | $A_1$ $A_0$ $A_2$ $A_3$ ... $A_{J-2}$ $A_{J-1}$ $A_J$ | |
| add_WL$_{n+1}$ – add_WL$_{n-1}$ | 1  0  0  0  ... 0  0  0 | → 4K (J=12) |
| SQ3 | $A_2$ $A_0$ $A_1$ $A_3$ ... $A_{J-2}$ $A_{J-1}$ $A_J$ | |
| add_WL$_{n+1}$ – add_WL$_{n-1}$ | 0  0  1  0  ... 0  0  0 | → 1K (J=12) |

FIG. 7

MEMORY DEVICE CAPABLE OF DETERMINING CANDIDATE WORDLINE FOR REFRESH AND CONTROL METHOD THEREOF

BACKGROUND OF THE INVENTION

1. Field of the Invention

The disclosed embodiments of the present invention relate to control of memory refresh operation, and more particularly, to a memory device capable of monitoring memory rows disturbed by activation of adjacent rows and adaptively determining row(s) to be refreshed, and a related control method thereof.

2. Description of the Prior Art

Memory cells in a volatile memory needs to be periodically refreshed to maintain integrity of data stored therein. However, as operating speeds of a memory keeps increasing, rows of the memory are activated relatively frequently. Data stored in a memory cell connected to a row (or a wordline) will be lost due to relatively frequent activation of adjacent row(s). In other words, a data access error occurs.

Thus, there is a need for a novel memory control mechanism to maintain data integrity in a high speed data access environment.

SUMMARY OF THE INVENTION

In accordance with exemplary embodiments of the present invention, a memory device capable of monitoring memory rows disturbed by activation of adjacent rows and adaptively determining row(s) to be refreshed, and a related control method thereof are proposed to solve the above-mentioned problems.

According to an embodiment of the present invention, an exemplary memory device is disclosed. The exemplary memory device comprises a plurality of normal wordlines, a plurality of redundant wordlines, an address generation circuit, an address processing circuit and a refresh control circuit. The address generation circuit is arranged for generating a first intermediate address according to a row address, wherein the first intermediate address comprises a first wordline address and a first identification code, and the first identification code indicates whether a first wordline indicated by the first wordline address is a normal wordline or a redundant wordline. The address processing circuit is coupled to the address generation circuit, and is arranged for referring to the first intermediate address to generate a second intermediate address indicating a second wordline adjacent to the first wordline, wherein the second intermediate address comprises a second wordline address and a second identification code, the second wordline address indicates the second wordline, and the second identification code indicates whether the second wordline is a normal wordline or a redundant wordline. The refresh control circuit is coupled to the address processing circuit, and is arranged for determining a disturbance count of the second wordline each time the first wordline is activated, and referring to the disturbance count to determine whether to output the second wordline address to refresh the second wordline, wherein the disturbance count indicates a number of times the second wordline is disturbed due to activation of one or more wordlines adjacent to the second wordline.

According to an embodiment of the present invention, an exemplary control method of a memory device is disclosed. The memory device comprises a plurality of normal wordlines and a plurality of redundant wordlines. The exemplary control method comprises the following steps: generating a first intermediate address according to a row address, wherein the first intermediate address comprises a first wordline address and a first identification code, and the first identification code indicates whether a first wordline indicated by the first wordline address is a normal wordline or a redundant wordline; referring to the first intermediate address to generate a second intermediate address indicating a second wordline adjacent to the first wordline, wherein the second intermediate address comprises a second wordline address and a second identification code, the second wordline address indicates the second wordline, and the second identification code indicates whether the second wordline is a normal wordline or a redundant wordline; and determining a disturbance count of the second wordline each time the first wordline is activated, and referring to the disturbance count to determine whether to output the second wordline address to refresh the second wordline, wherein the disturbance count indicates a number of times the second wordline is disturbed due to activation of one or more wordlines adjacent to the second wordline.

By monitoring memory rows disturbed by activation of adjacent rows and rearranging a count sequence of a refresh counter, the proposed memory control mechanism may effectively maintain data integrity without entering a conventional target row refresh mode, thus reducing the cost and complexity of the memory circuitry. Additionally, by utilizing an identification code indicating a wordline type, the proposed memory control mechanism may be applicable to activation/refresh of a normal wordline, a redundant wordline, a boundary wordline and a non-boundary wordline.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 is a diagram illustrating implementations of count bits utilized by the refresh counter shown in FIG. 2 according to an embodiment of the present invention.

DETAILED DESCRIPTION

The proposed memory control mechanism may monitor memory rows (or wordlines) disturbed by activation of adjacent rows and accordingly adaptively determine row(s) to be refreshed, thereby reducing/eliminating effects of frequent row access on data integrity. In addition, the proposed memory control mechanism may generate an intermediate address indicating a wordline type (a normal wordline or a redundant wordline) so as to simplify/improve memory access operations. Further description is provided below.

Figure 1:
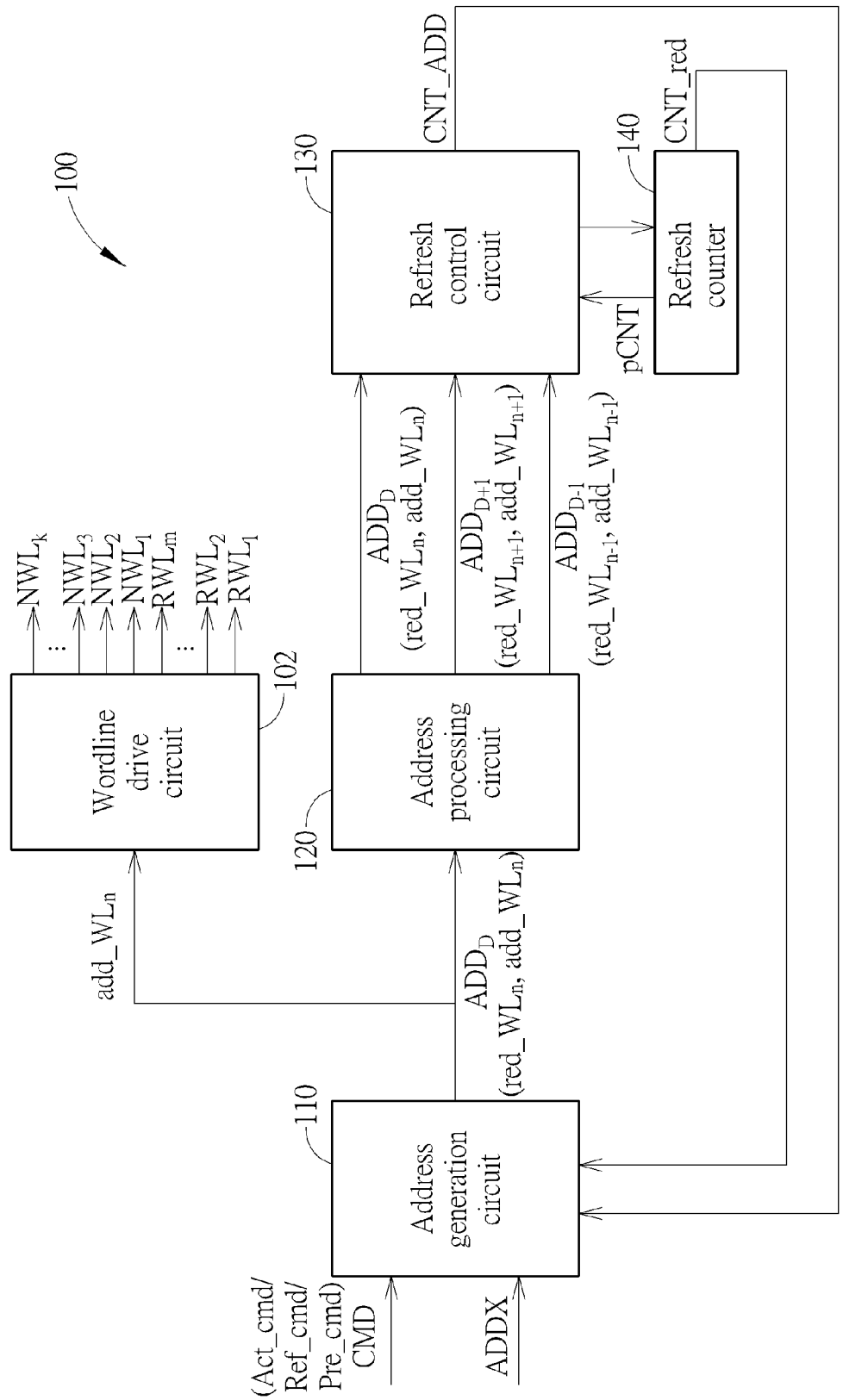
FIG. 1 is a block diagram illustrating an exemplary memory device according to an embodiment of the present invention.

Please refer to FIG. 1, which is a block diagram illustrating an exemplary memory device according to an embodiment of the present invention. The memory device 100 may include, but is not limited to, a wordline drive circuit 102, an address generation circuit 110, an address processing circuit 120, a refresh control circuit 130, a refresh counter 140, a plurality of normal wordlines $NWL_1$-$NWL_k$ (k is a positive integer greater than 1) and a plurality of redundant wordlines $RWL_1$-$RWL_m$ (m is a positive integer greater than 1), wherein each redundant wordline may be used for replacing a defective normal wordline. The address generation circuit 110 may receive a row address ADDX in response to a command signal CMD (e.g. an activate command Act_cmd, a refresh command Ref_cmd or a precharge command Pre_cmd), and generate an intermediate address $ADD_D$ according to the row address ADDX. The intermediate address $ADD_D$ may include a wordline address $add\_WL_n$ and an identification code $red\_WL_n$, and the identification code $red\_WL_n$ may indicate whether a wordline $WL_n$ indicated by the wordline address $add\_WL_n$ is a normal wordline (one of the normal wordlines $NWL_1$-$NWL_k$) or a redundant wordline (one of the redundant wordlines $RWL_1$-$RWL_m$). Hence, the wordline drive circuit 102 may drive the wordline $WL_n$ according to the wordline address $add\_WL_n$ provided by the address generation circuit 110.

For example, in a case where the row address ADDX indicates one of the normal wordlines $NWL_1$-$NWL_k$, the address generation circuit 110 may determine whether said one of the normal wordlines $NWL_1$-$NWL_k$ is defective; when said one of the normal wordlines $NWL_1$-$NWL_k$ is not defective, the address generation circuit 110 may use the row address ADDX as the wordline address $add\_WL_n$, and set the identification code $red\_WL_n$ to a first bit pattern (e.g. a bit pattern "0"). In other words, the wordline $WL_n$ is said one of the normal wordlines $NWL_1$-$NWL_k$. Additionally, when said one of the normal wordlines $NWL_1$-$NWL_k$ is defective, the address generation circuit 110 may use a redundant wordline address indicating one of the redundant wordlines $RWL_1$-$RWL_m$ as the wordline address $add\_WL_n$, and set the identification code $red\_WL_n$ to a second bit pattern different from the first bit pattern (e.g. a bit pattern "1"). In other words, the wordline drive circuit 102 may drive a redundant wordline indicated by the redundant wordline address rather than said one of the normal wordlines $NWL_1$-$NWL_k$.

Please note that, when the wordline drive circuit 102 activates the wordline $WL_n$ indicated by the intermediate address $ADD_D$, one or more wordlines adjacent to the wordline $WL_n$ may be disturbed. The refresh control circuit 130 may be used for monitoring effects of activation of the wordline $WL_n$ on adjacent wordline(s) of the wordline $WL_n$, thereby determining whether to refresh the adjacent wordline(s). For example, in a case where the command signal CMD received by the address generation circuit 110 is the activate command Act_cmd, the address processing circuit 120 (coupled to the address generation circuit 110) may refer to the intermediate address $ADD_D$ to generate intermediate address(es) indicating one or more wordlines adjacent to the wordline $WL_n$ indicated by the intermediate address $ADD_D$. In this embodiment, the address processing circuit 120 may refer to the intermediate address $ADD_D$ to generate an intermediate address $ADD_{D+1}$ and an intermediate address $ADD_{D-1}$, wherein a wordline $WL_{n+1}$ indicated by the intermediate address $ADD_{D+1}$ and a wordline $WL_{n-1}$ indicated by the intermediate address $ADD_{D-1}$ are adjacent to the wordline $WL_n$. The intermediate address $ADD_{D+1}$ may include a wordline address $add\_WL_{n+1}$ and an identification code $red\_WL_{n+1}$, where the wordline address $add\_WL_{n+1}$ indicates the wordline $WL_{n+1}$ and the identification code $red\_WL_{n+1}$ indicates whether the wordline $WL_{n+1}$ is a normal wordline or a redundant wordline. Similarly, the intermediate address $ADD_{D-1}$ may include a wordline address $add\_WL_{n-1}$ and an identification code $red\_WL_{n-1}$, where the wordline address $add\_WL_{n-1}$ indicates the wordline $WL_{n-1}$ and the identification code $red\_WL_{n-1}$ indicates whether the wordline $WL_{n-1}$ is a normal wordline or a redundant wordline.

For illustrative purposes, the normal wordline $NWL_1$ is used as an example of the wordline $WL_n$ indicated by the wordline address $add\_WL_n$ (or the intermediate address $ADD_D$) to describe the proposed refresh operation in the following paragraphs. However, this is not meant to be a limitation of the present invention. In a case where the wordline $WL_n$ is the normal wordline $NWL_1$, the wordline $WL_{n+1}$ may be the normal wordline $NWL_2$, and the wordline $WL_{n-1}$ may be the redundant wordline $RWL_m$. The refresh control circuit 130 (coupled to the address processing circuit 120) may determine a disturbance count of the normal wordline $NWL_2$ each time the normal wordline $NWL_1$ is activated in response to the activate command Act_cmd, wherein the disturbance count of the normal wordline $NWL_2$ indicates a number of times the normal wordline $NWL_2$ is disturbed due to activation of one or more wordlines adjacent to the normal wordline $NWL_2$ (e.g. the normal wordline $NWL_1$ and/or the normal wordline $NWL_3$). Next, the refresh control circuit 130 may refer to the disturbance count to determine whether to output the wordline address $add\_WL_{n+1}$ to refresh the normal wordline $NWL_2$. By way of example but not limitation, when the disturbance count is greater than or equal to a predetermined threshold, the refresh control circuit 130 may determine to output the wordline address $add\_WL_{n+1}$ to refresh the normal wordline $NWL_2$, wherein the predetermined threshold may be, but is not limited to, a maximum activate number (tMAC) of the memory device 100. The tMAC is a maximum number of activates that a single row/wordline can sustain within a time interval of equal to or less than a maximum activate window (tMAW) before the adjacent rows/wordlines need to be refreshed regardless of how the activates are distributed over tMAW.

Similarly, the refresh control circuit 130 may determine a disturbance count of the redundant wordline $RWL_m$ (used for replacing one normal wordline) each time the normal wordline $NWL_1$ is activated in response to the activate command Act_cmd, wherein the disturbance count of the redundant wordline $RWL_m$ indicates a number of times the redundant wordline $RWL_m$ is disturbed due to activation of one or more wordlines adjacent to the redundant wordline $RWL_m$. Next, the refresh control circuit 130 may refer to the disturbance count to determine whether to output the wordline address $add\_WL_{n-1}$ to refresh the redundant wordline $RWL_m$.

The refresh counter 140 is coupled to the refresh control circuit 130, and is arranged for counting wordline addresses to provide a refresh address pCNT for a refresh operation. In some embodiments, when determining to refresh the normal wordline $NWL_2$ (or the redundant wordline $RWL_m$), the refresh control circuit 130 may output the wordline address add_WL$_{n+1}$ (or the wordline address add_WL$_{n-1}$) before outputting the refresh address pCNT such that the normal wordline NWL$_2$ (or the redundant wordline RWL$_m$) is refreshed before a predetermined wordline indicated by the refresh address pCNT is refreshed.

Additionally, the refresh control circuit 130 may output a wordline address CNT_ADD indicating a wordline to be refreshed in response to the refresh command Ref_cmd, and the refresh counter 140 may output an identification code CNT_red corresponding to the wordline to be refreshed in response to the refresh command Ref_cmd. For example, when determining to output the wordline address add_WL$_{n+1}$ to refresh the wordline NWL$_2$, the refresh control circuit 130 may output the wordline address add_WL$_{n+1}$ as the wordline address CNT_ADD in response to the refresh command Ref_cmd, and the refresh counter 140 may output the identification code red_WL$_{n+1}$ as the identification code CNT_red in response to the refresh command Ref_cmd. In another example where the refresh control circuit 130 determines not to output the wordline address add_WL$_{n+1}$, the refresh control circuit 130 may output the refresh address pCNT as the wordline address CNT_ADD in response to the refresh command Ref_cmd, and the refresh counter 140 may output the identification code CNT_red in response to the refresh command Ref_cmd, wherein the identification code CNT_red indicates whether a wordline indicated by the refresh address pCNT is a normal wordline or a redundant wordline.

After the refresh control circuit 130 outputs the wordline address CNT_ADD and the refresh counter 140 outputs the identification code CNT_red, the address generation circuit 110 may receive and latch the wordline address CNT_ADD and the identification code CNT_red for a refresh operation.

It should be noted that, in some embodiments, the refresh control circuit 130 may further store at least one disturbance record and selectively modify the at least one disturbance record, wherein each of the at least one disturbance record is associated with a disturbance count of a wordline. For example, when the wordline WL$_n$ is activated in response to the activate command Act_cmd, the refresh control circuit 130 may check if a disturbance record associated with the wordline WL$_n$ is stored in the refresh control circuit 130. When the refresh control circuit 130 stores the disturbance record associated with the wordline WL$_n$, the refresh control circuit 130 may discard/delete the disturbance record associated with the wordline WL$_n$ since the activation of the wordline WL$_n$ may help maintain integrity of data stored in a memory cell connected to the wordline WL$_n$. In another example where the wordline WL$_n$ is refreshed in response to the refresh command Ref_cmd, the refresh control circuit 130 may check if the disturbance record associated with the wordline WL$_n$ is stored in the refresh control circuit 130. When the refresh control circuit 130 stores the disturbance record associated with the wordline WL$_n$, the refresh control circuit 130 may discard/delete the disturbance record associated with the wordline WL$_n$ since the wordline WL$_n$ is to be or being refreshed.

In yet another example, regarding each disturbance record stored in the refresh control circuit 130, the refresh control circuit 130 may determine once every K activate commands whether the disturbance record has been modified within a period of time during which the K active commands are issued (K is a positive integer greater than one). In other words, the refresh control circuit 130 may determine once every predetermined time period (the period of time during which K active commands are issued) whether the disturbance record has been modified within the corresponding predetermined time period. When determining that the disturbance record has not been modified, the refresh control circuit 130 may decrease the disturbance count of the wordline by a predetermined value (e.g. one).

Consider a case where the refresh control circuit 130 determines not to refresh the normal wordline NWL$_2$ (e.g. the wordline WL$_{n+1}$). The refresh control circuit 130 may store a disturbance record associated with the disturbance count of the normal wordline NWL$_2$ so as to monitor whether the disturbance count will exceeds the predetermined threshold in next activate operations. If the disturbance record associated with the normal wordline NWL$_2$ has not been modified during a predetermined time period (e.g. a period of time during which K active commands are issued), this means that the refresh counter 140 may have an increased likelihood of counting to the wordline address add_WL$_{n+1}$ before the disturbance count associated with the normal wordline NWL$_2$ exceeds the predetermined threshold. Hence, the refresh control circuit 130 may decrease the disturbance count of the normal wordline NWL$_2$ by a predetermined value (e.g. one).

Please note that the aforementioned K value may be greater than or equal to a maximum number of wordlines each having a maximum activate count (tMAC) within a refresh period (tREF), where the maximum number of wordlines may be determined by the following expression:

$$tREF/(tMAC \times tRC),$$

where tRC is a row cycle time of the memory device 100. However, this is not meant to be a limitation of the present invention. In an alternative design, K may be determined according to actual design considerations.

In view of the above, as the proposed memory control mechanism may utilize an intermediate address including an identification code to record a corresponding wordline address and a wordline type (a normal wordline or a redundant wordline), the proposed memory control mechanism may be used for determining whether to refresh adjacent wordline(s) of an activated wordline, no matter what type of wordline the activated wordline is. Specifically, the activated wordline may be a boundary normal wordline (adjacent to only one normal wordline; e.g. the normal wordline NWL$_1$ or NWL$_k$), an internal normal wordline (adjacent wordlines are normal wordlines; e.g. the normal wordline NWL$_2$), a boundary redundant wordline (adjacent to only one redundant wordline; e.g. the normal wordline RWL$_1$ or RWL$_m$) or an internal redundant wordline (adjacent wordlines are redundant wordlines; e.g. the normal wordline RWL$_2$).

Furthermore, as the proposed memory control mechanism may dynamically monitor effects of activation of a wordline on adjacent wordline(s) during wordline activation, the proposed memory control mechanism may adaptively adjust wordline address(es) for next refresh operation(s). In other words, the proposed memory control mechanism does not need to determine whether to enter a target row refresh mode before refreshing disturbed adjacent wordlines. This may reduce the cost and complexity of the memory circuitry.

Figure 2:
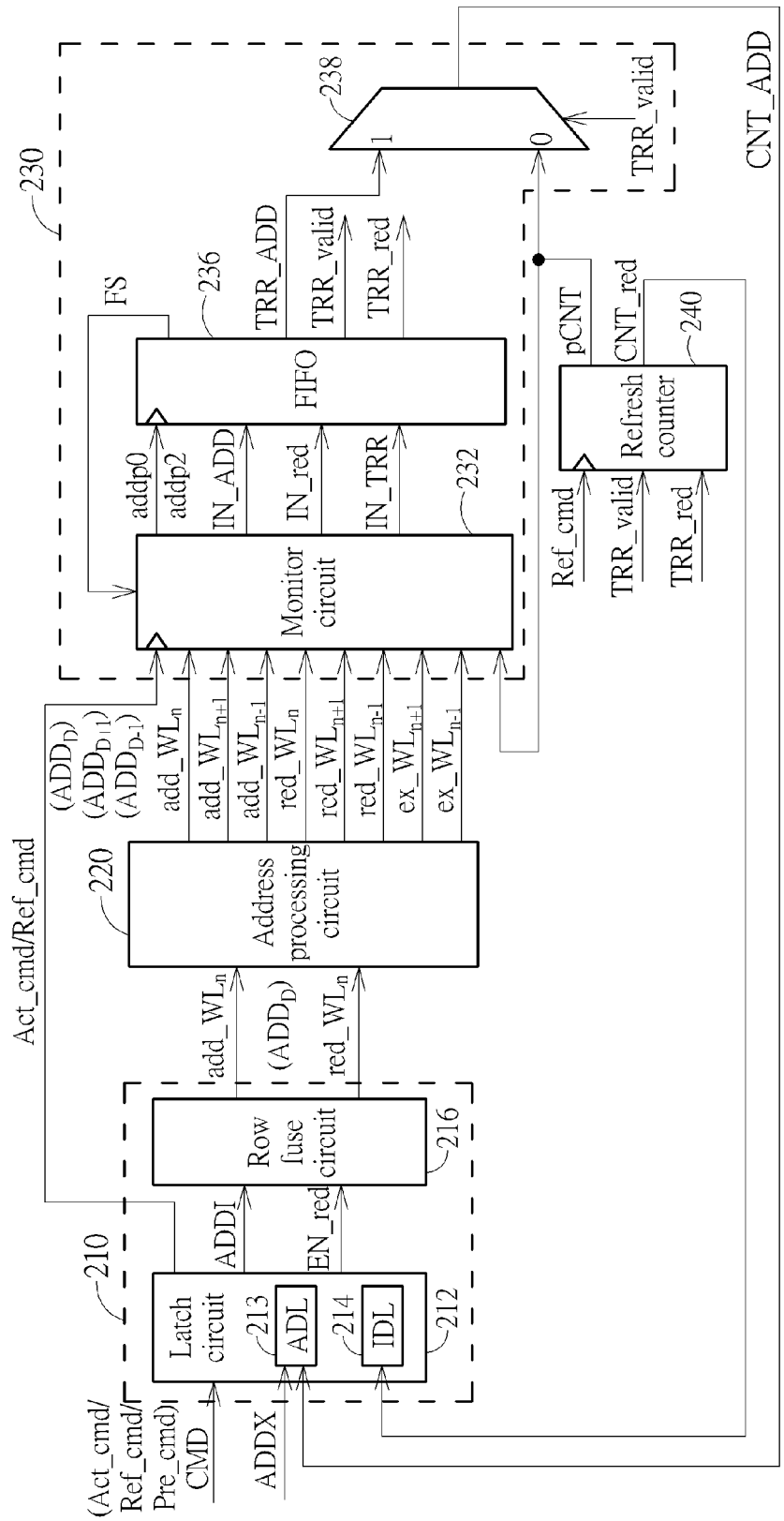
FIG. 2 is a diagram illustrating an implementation of the memory control circuit shown in FIG. 1 according to an embodiment of the present invention.
Figure 3:
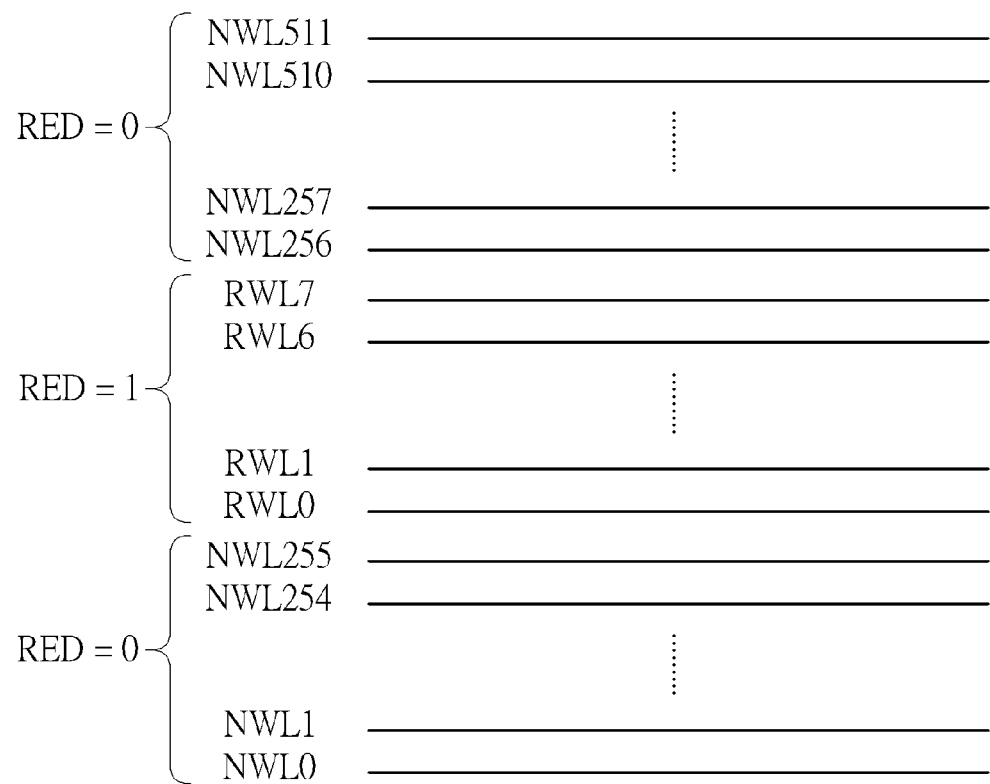
FIG. 3 is an implementation of the wordlines shown in FIG. 1 according to an embodiment of the present invention.

The memory control circuit shown in FIG. 1 (including the address generation circuit 110, the address processing circuit 120, the refresh control circuit 130 and the refresh counter 140) is a basic architecture based on the concept of the present invention. Any circuit employing the architecture shown in FIG. 1 falls within the scope of the present invention. To facilitate an understanding of the present invention, an exemplary implementation is given in the following for further description of the proposed memory device. It should be noted that other circuit implementations employing the architecture shown in FIG. 1 are feasible. Please refer to FIG. 2 and FIG. 3 together. FIG. 2 is a diagram illustrating an implementation of the memory control circuit shown in FIG. 1 according to an embodiment of the present invention, and FIG. 3 is an implementation of the wordlines shown in FIG. 1 according to an embodiment of the present invention. The memory device 200 may include, but is not limited to, an address generation circuit 210, an address processing circuit 220, a refresh control circuit 230, a refresh counter 240 and a plurality of wordlines, wherein at least a portion (a portion or all) of the wordlines may be implemented by a plurality of normal wordlines NWL0-NWL511 and a plurality of redundant wordlines RWL0-RWL7. Additionally, the address generation circuit 110, the address processing circuit 120, the refresh control circuit 130 and the refresh counter 140 shown in FIG. 1 may be implemented by the address generation circuit 210, the address processing circuit 220, the refresh control circuit 230 and the refresh counter 240, respectively.

The address generation circuit 210 may include, but is not limited to, a latch circuit 212 and a row fuse circuit 216. The latch circuit 212 may latch the command signal CMD (the activate command Act_cmd, the refresh command Ref_cmd or the precharge command Pre_cmd) and the row address ADDX, and accordingly generate a latched row address ADDI. The row fuse circuit 216 may generate the intermediate address $ADD_D$ according to the latched row address ADDI, wherein the intermediate address $ADD_D$ may include the wordline address add_$WL_n$ and the identification code red_$WL_n$, and indicate the wordline $WL_n$ (one of the normal wordlines NWL0-NWL511 and the redundant wordlines RWL0-RWL7 shown in FIG. 3). The row fuse circuit 216 may further output the wordline address add_$WL_n$ to a wordline drive circuit (not shown in FIG. 2) for wordline driving.

Next, the address processing circuit 220 may refer to the wordline address add_$WL_n$ and the identification code red_$WL_n$ to generate the wordline address add_$WL_{n+1}$, the identification code red_$WL_{n+1}$, the wordline address add_$WL_{n-1}$ and the identification code red_$WL_{n-1}$ (the intermediate address $ADD_{D+1}$ indicating the wordline $WL_{n+1}$, and the intermediate address $ADD_{D-1}$ indicating the wordline $WL_{n-1}$).

By way of example but not limitation, in a case where the latched row address ADDI indicates the normal wordline NWL256, the row fuse circuit 216 may determine whether the normal wordline NWL256 is defective. When it is determined that the normal wordline NWL256 is not defective, the row fuse circuit 216 may output the latched row address ADDI as the wordline address add_$WL_n$ (i.e. the wordline $WL_n$ is the normal wordline NWL256), and set the identification code red_$WL_n$ to 0 (indicating a normal wordline). When it is determined that the normal wordline NWL256 is defective and is replaced with the redundant wordline RWL1, the row fuse circuit 216 may output a wordline address corresponding to the redundant wordline RWL1 as the wordline address add_$WL_n$ (i.e. the wordline $WL_n$ is the redundant wordline RWL1), and set the identification code red_$WL_n$ to 1 (indicating a redundant wordline). Hence, in one example where the latched row address ADDI indicates the normal wordline NWL256 which is non-defective, the wordline address add_$WL_{n+1}$ may indicate the normal wordline NWL257 (the wordline $WL_{n+1}$), and the wordline address add_$WL_{n-1}$ may indicate the redundant wordline RWL7 (the wordline $WL_{n-1}$).

The address processing circuit 220 may further generate an indication signal ex_$WL_{n+1}$ to indicate whether the wordline $WL_{n+1}$ indicated by the wordline address add_$WL_{n+1}$ exists, and generate an indication signal ex_$WL_{n-1}$ to indicate whether the wordline $WL_{n-1}$ indicated by the wordline address add_$WL_{n-1}$ exists. For example, in a case where the wordline $WL_n$ is a boundary wordline (e.g. the normal wordline NWL511 or the normal wordline NWL0), one of the wordline $WL_{n+1}$ and the wordline $WL_{n-1}$ may not exist.

Please note that, when each of the wordline $WL_{n+1}$ and the wordline $WL_{n-1}$ exists, control operations associated with the wordline $WL_{n+1}$ are identical/similar to those associated with the wordline $WL_{n-1}$. Hence, the proposed monitor mechanism used for adjacent wordline(s) of an activated wordline is described with reference to the wordline $WL_{n+1}$ in the following description for the sake of brevity.

The refresh control circuit 230 may include, but is not limited to, a monitor circuit 232, a storage circuit (implemented by a first-in first-out (FIFO) register 236 in this embodiment) and a selection circuit 238. The monitor circuit 232 may monitor effects of activation of a wordline on adjacent wordline(s) in response to the activate command Act_cmd and/or the refresh command Ref_cmd, and accordingly output an input wordline address IN_ADD, an input identification code IN_red and an enable signal IN_TRR. For example, the monitor circuit 232 may calculate (or update) a disturbance count of the wordline $WL_{n+1}$ (and/or the wordline $WL_{n-1}$) each time the wordline $WL_n$ is activated (e.g. incrementing the disturbance count by one), and refer to the disturbance count to determine whether to refresh the wordline $WL_{n+1}$. When the monitor circuit 232 determines that the disturbance count of the wordline $WL_{n+1}$ meets a refresh criterion (e.g. the disturbance count is greater than or equal to a predetermined threshold), the monitor circuit 232 may output the intermediate address $ADD_{D+1}$ so as to refresh the wordline $WL_{n+1}$, and enable the FIFO register 236 to store the input wordline address IN_ADD and the input identification code IN_red according to the enable signal IN_TRR. The input wordline address IN_ADD may be the wordline address add_$WL_{n+1}$ indicating the wordline $WL_{n+1}$, and the input identification code IN_red may indicate whether the wordline $WL_{n+1}$ is a normal wordline or a redundant wordline (i.e. the identification code red_$WL_{n+1}$). In other words, the monitor circuit 232 may determine that the wordline $WL_{n+1}$ is a candidate wordline for refresh (a wordline needs to be refreshed), and store the intermediate address $ADD_{D+1}$ associated the candidate wordline for refresh as a buffer record in the FIFO register 236.

In some embodiments, the FIFO register 236 may further store at least one other buffer record, wherein each of the at least one other buffer record indicates a candidate wordline for refresh. By way of example but not limitation, before determining that the wordline $WL_{n+1}$ is a candidate wordline for refresh, the monitor circuit 232 may have determined other candidate wordline(s) for refresh in response to previous activate commands. Hence, the FIFO register 236 may store one or more intermediate addresses associated with respective candidate wordlines as buffer records.

Next, the FIFO register 236 may output an intermediate address associated with a candidate wordline according to one or more buffer records stored therein. For example, when the FIFO register 236 stores only one buffer record associated with the wordline $WL_{n+1}$, the FIFO register 236 may output the received input wordline address IN_ADD (the wordline address add_$WL_{n+1}$) as an output wordline address TRR_ADD, and output the received input identification code IN_red (the identification code red_WL$_{n+1}$) as an output identification code TRR_red. In another example where the FIFO register 236 further stores other buffer record(s), the FIFO register 236 may output intermediate addresses corresponding to the stored buffer records (including the buffer record associated with the wordline WL$_{n+1}$) in an order in which the intermediate addresses arrive at the FIFO register 236. In other words, the FIFO register 236 may output a wordline address and a corresponding identification code associated with each buffer record as the output wordline address TRR_ADD and the output identification code TRR_red, respectively.

The selection circuit 238 is coupled to the FIFO register 236 and the refresh counter 240, and may determine the wordline address CNT_ADD (indicating a wordline to be refreshed) according to whether or not at least one buffer record is stored in the FIFO register 236. For example, after the monitor circuit 232 determines the disturbance count of the wordline WL$_{n+1}$ in response to activation of the wordline WL$_n$, the selection circuit 238 may output one of the wordline address WL$_{n+1}$ and the refresh address pCNT according to a selection signal TRR_valid generated from the FIFO register 236, wherein the selection signal TRR_valid may indicate whether or not a buffer record associated with the wordline WL$_{n+1}$ is stored in the FIFO register 236. Specifically, when the monitor circuit 232 determines to refresh the wordline WL$_{n+1}$ such that the FIFO register 236 stores the intermediate address ADD$_{D+1}$ outputted from the monitor circuit 232 as a buffer record, the FIFO register 236 may generate the selection signal TRR_valid (e.g. having a logic level "1") to enable the selection circuit 238 to output the wordline address add_WL$_{n+1}$ as the wordlines address CNT_ADD. When the monitor circuit 232 determines not to refresh the wordline WL$_{n+1}$ such that the FIFO register 236 does not store the intermediate address ADD$_{D+1}$, the FIFO register 236 may generate the selection signal TRR_valid (e.g. having a logic level "0") to enable the selection circuit 238 to output the refresh address pCNT as the wordlines address CNT_ADD.

In other words, when the FIFO register 236 stores at least one buffer record associated with a candidate wordline for refresh (e.g. the buffer record associated with the wordline WL$_{n+1}$), the selection circuit 238 may select the output wordline address TRR_ADD as the wordlines address CNT_ADD according to the selection signal TRR_valid having a first signal level (e.g. a logic level "1"). The wordline WL$_{n+1}$ may be refreshed before a wordline indicated by the refresh address pCNT is refreshed. Additionally, when there is no buffer record stored in the FIFO register 236, the selection circuit 238 may select the refresh address pCNT as the wordlines address CNT_ADD according to the selection signal TRR_valid having a second signal level (e.g. a logic level "0"). The memory device 200 may perform a default refresh operation accordingly.

In addition, the refresh counter 240 may receive the selection signal TRR_valid and accordingly determine the identification code CNT_red associated with a wordline to be refreshed. For example, when the selection signal TRR_valid generated from the FIFO register 236 has the first signal level, the refresh counter 240 may output the output identification code TRR_red as the identification code CNT_red associated with the wordline to be refreshed; when the selection signal TRR_valid generated from the FIFO register 236 has the second signal level, the refresh counter 240 may set the identification code CNT_red to a specific bit pattern (e.g. a bit pattern "0").

Please note that the refresh counter 240 may further selectively increment the refresh address pCNT according to the selection signal TRR_valid. For example, when the selection signal TRR_valid has the first signal level, a count value of the refresh counter 240 (the refresh address pCNT) may remain unchanged since the selection circuit 238 selects the output wordline address TRR_ADD as the wordlines address CNT_ADD for a subsequent refresh operation; when the selection signal TRR_valid has the second signal level, a count value of the refresh counter 240 (the refresh address pCNT) is incremented to a next address since the selection circuit 238 selects the refresh address pCNT as the wordlines address CNT_ADD for a subsequent refresh operation.

The following provides further exemplary details of embodiments described above. These portions are provided only to provide examples of the above memory control mechanism and are not intended to limit the scope of the descriptions herein. Thus, while specific memory parameters, circuit implementations, and control signals are provided, these are exemplary only and other specific details are envisioned.

Please refer to FIG. 2 again. In this embodiment, the address generation circuit 212 may include an address latch (labeled "ADL") 213 and an identification code latch (labeled "IDL") 214. The address latch 213 may latch the row address ADDX and accordingly generate the latched row address ADDI. Additionally, during a refresh operation, the address latch 213 may latch the wordline address CNT_ADD outputted from the selection circuit 238, and accordingly generate the latched row address ADDI.

Figure 4:
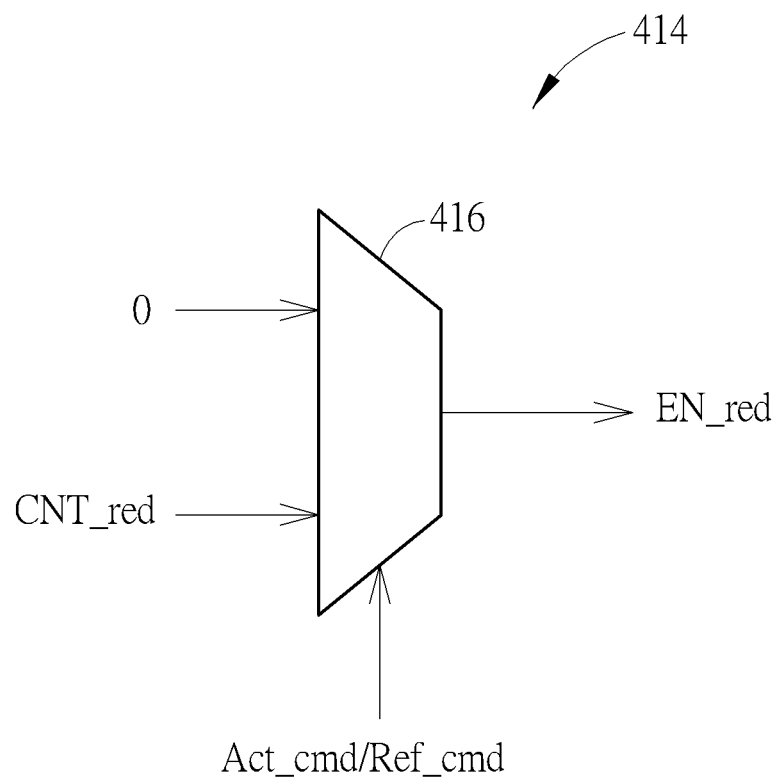
FIG. 4 is an implementation of the identification code latch shown in FIG. 2 according to an embodiment of the present invention.

The identification code latch 214 may latch the identification code CNT_red outputted from the refresh counter 240, and accordingly generate a latched identification code EN_red for the row fuse circuit 216 to determine a wordline type. Please refer to FIG. 4 in conjunction with FIG. 2. FIG. 4 is an implementation of the identification code latch 214 shown in FIG. 2 according to an embodiment of the present invention. The identification code latch 414 may include, but is not limited to, a selection circuit 416, wherein the selection circuit 416 may output latched identification code EN_red in response to the activate command Act_cmd and the refresh command Ref_cmd. For example, when the command signal CMD received by the latch circuit 212 is the activate command Act_cmd, the selection circuit 416 may select a specific bit pattern (e.g. "0") as the latched identification code EN_red; when the command signal CMD received by the latch circuit 212 is the refresh command Ref_cmd, the selection circuit 416 may select the identification code CNT_red as the latched identification code EN_red. Next, the row fuse circuit 216 may refer to the latched identification code EN_red to select/enable a normal wordline or a redundant wordline.

Figure 5:
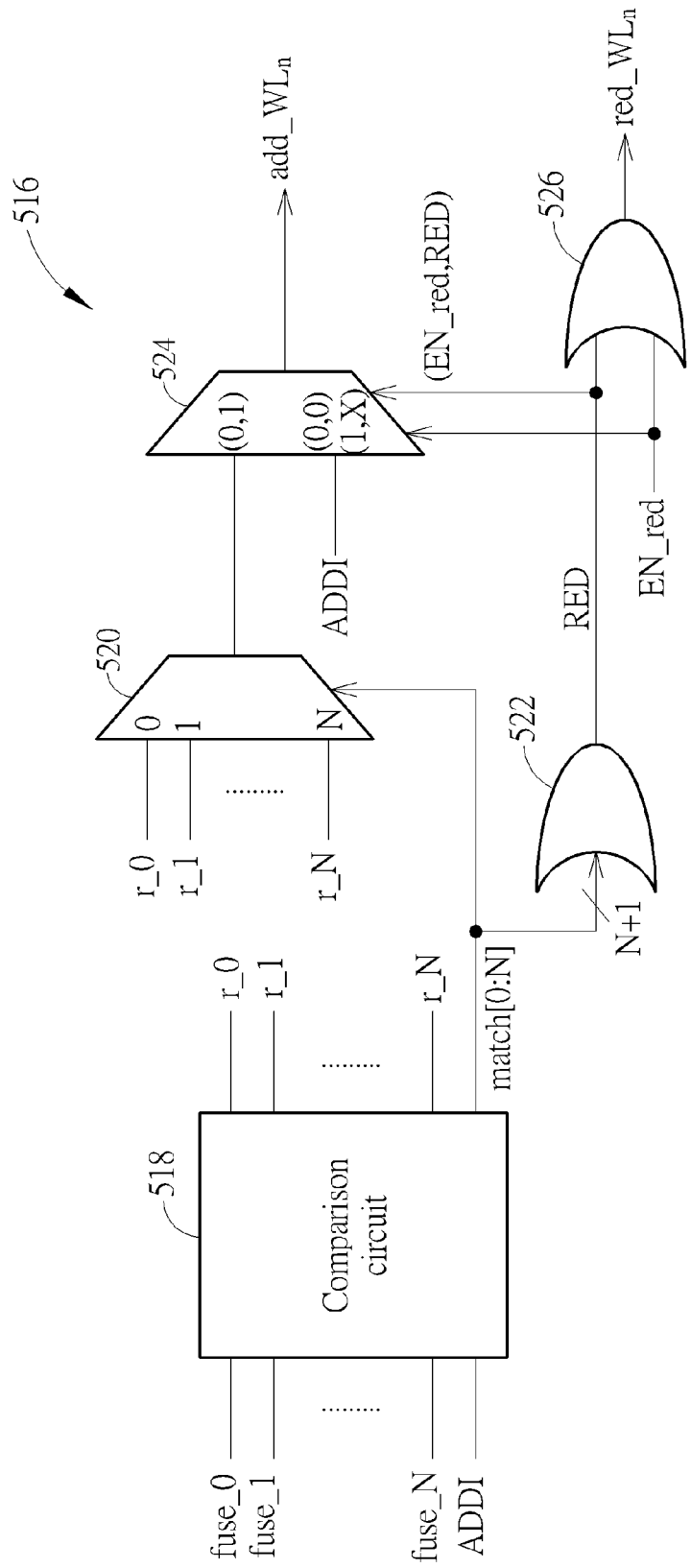
FIG. 5 illustrates an implementation of the row fuse circuit shown in FIG. 2 according to an embodiment of the present invention.

FIG. 5 illustrates an implementation of the row fuse circuit 216 shown in FIG. 2 according to an embodiment of the present invention. The row fuse circuit 516 may include, but is not limited to, a comparison circuit 518, a selection circuit 520, an OR gate 522, a selection circuit 524 and an OR gate 526. Firstly, the comparison circuit 518 may compare the latched row address ADDI with N+1 defective addresses fuse_0-fuse_N (N is a positive integer) to generate a comparison result match[0:N] (an (N+1)-bit output), wherein the comparison result match[0:N] may indicate whether the latched row address ADDI matches one of the N+1 defective addresses fuse_0-fuse_N. For example, when the latched row address ADDI matches the defective addresses fuse_0, a bit match[0] of the comparison result match[0:N] may be set to a logic level "1"; when the latched row address ADDI does not match any of the N+1 defective addresses fuse_0-fuse_N, each bit of the comparison result match[0:N] may be set to a logic level "0".

Next, the selection circuit 520 may selectively output one of N+1 redundant wordline addresses r_0-r_N according to the comparison result match[0:N], wherein redundant wordline addresses corresponding to the redundant wordlines RWL0-RWL7 shown in FIG. 3 may be implemented by at least a portion of the N+1 redundant wordline addresses r_0-r_N. For example, when the latched row address ADDI matches the defective address fuse_0, the selection circuit 520 may refer to the comparison result match[0:N] to output the redundant wordline address r_0 corresponding to the bit match[0]; when the latched row address ADDI does not match any of the N+1 defective addresses fuse_0-fuse_N, the selection circuit 520 may not output any of the N+1 redundant wordline addresses r_0-r_N.

Further, the OR gate 522 may output an identification code RED according to N+1 bits of the comparison result match[0:N]. For example, when a wordline indicated by the latched row address ADDI is a defective wordline, one bit of the comparison result match[0:N] may be set to a logic level "1". The selection circuit 520 may output a redundant wordline address to replace a wordline address of the defective wordline, and the OR gate 522 may output the identification code RED having a bit pattern "1" to indicate that the defective wordline is replaced with a redundant wordline. In another example where wordline indicated by the latched row address ADDI is non-defective, as each bit of the comparison result match[0:N] may be set to a logic level "0", the OR gate 522 may output the identification code RED having a bit pattern "0".

The selection circuit 524 may refer to the latched identification code EN_red shown in FIG. 2 and the identification code RED to determine whether to select the latched row address ADDI as the wordline address add_WL$_n$. For example, in a case where the latched identification code EN_red has a bit pattern "0" and the identification code RED has a bit pattern "1", this means that a wordline indicated by the latched row address ADDI is replaced with a predetermined redundant wordline. Hence, the selection circuit 524 may output a redundant wordline address of the predetermined redundant wordline as the wordline address add_WL$_n$. In another example where the latched identification code EN_red has a bit pattern "0" and the identification code RED has a bit pattern "0", this means that the wordline indicated by the latched row address ADDI is non-defective. Hence, the selection circuit 524 may output the latched row address ADDI as the wordline address add_WL$_n$. In yet another example where the latched identification code EN_red has a bit pattern "1", this means that the memory device 200 refreshes a redundant wordline in response to the refresh command Ref_cmd. Hence, whether the identification code RED has a bit pattern "1" or a bit pattern "0", the selection circuit 524 may output the latched row address ADDI as the wordline address add_WL$_n$. Please note that the symbol "(1,X)" shown in the selection circuit 524 means that a bit pattern of the identification code RED is "don't care".

The OR gate 526 may be arranged for determining the identification code red_WL$_n$ according to the latched identification code EN_red and the identification code RED. In other words, as long as a defective wordline is detected or a wordline to be refreshed is a redundant wordline, the OR gate 526 may output the identification code red_WL$_n$ having a specific bit pattern (e.g. a bit pattern "1").

Please refer to FIG. 2 again. After the intermediate addresses ADD$_D$ (the wordline address add_WL$_n$ and the identification code red_WL$_n$) is determined, the address processing circuit 220 may receive the intermediate addresses ADD$_D$ to provide the intermediate addresses ADD$_D$, ADD$_{D+1}$ and ADD$_{D-1}$ for the monitor circuit 232. The monitor circuit 232 may monitor the effects of activation of the wordline WL$_n$ on the adjacent wordlines WL$_{n+1}$ and WL$_{n-1}$ accordingly. Please note that, in some embodiments, The monitor circuit 232 may further refer to a buffer state FS of the FIFO register 236, the refresh address pCNT and/or related memory parameters to monitor the wordline disturbance. Further description is provided below.

Figure 6:
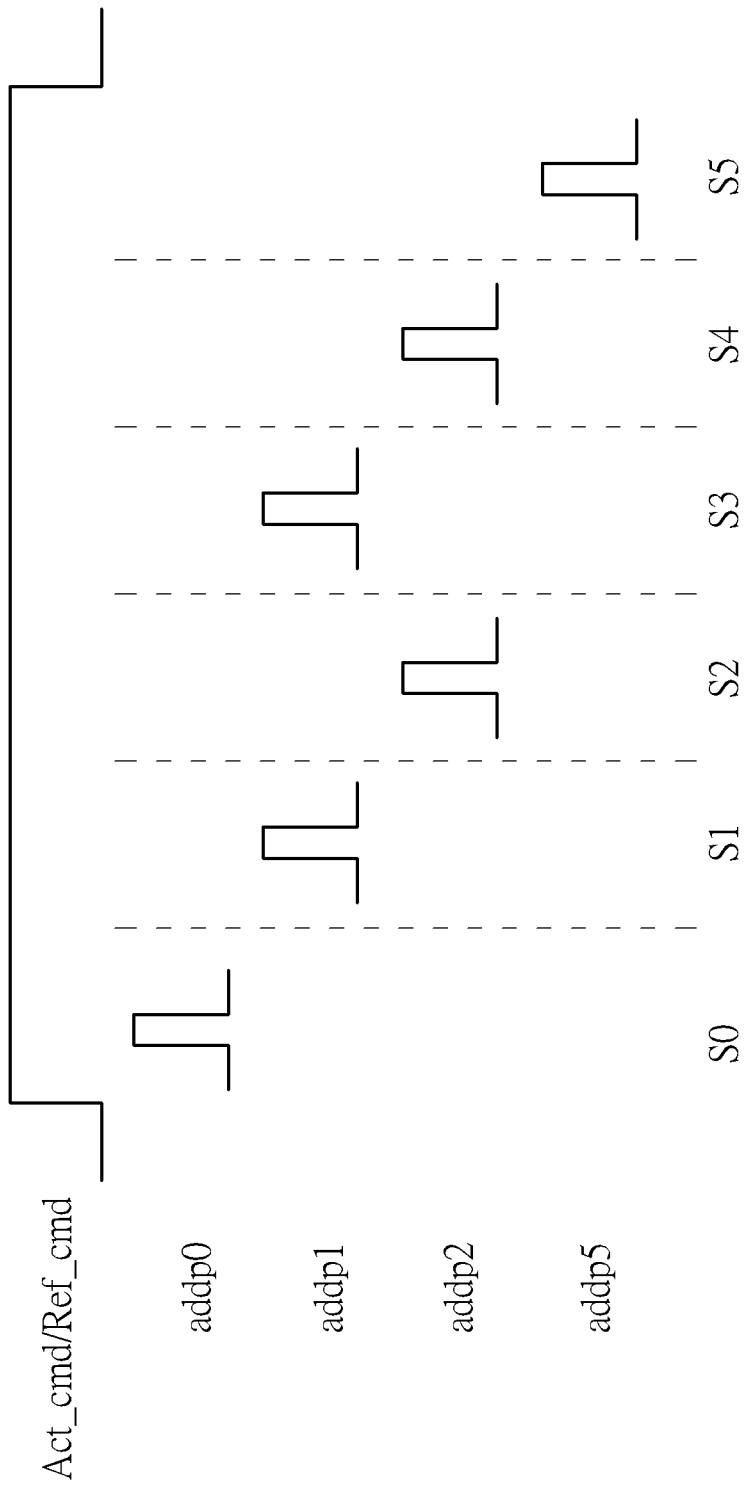
FIG. 6 is a timing diagram of the operating of the monitor circuit according to an embodiment of the present invention.

Please refer to FIG. 6 in conjunction with FIG. 2. FIG. 6 is a timing diagram of the operating of the monitor circuit 232 according to an embodiment of the present invention. In the embodiment shown in FIG. 6, during a period of time when the active command Act_cmd is issued to activate the wordline WL$_n$ (or the refresh command Ref_cmd is issued to refresh the wordline WL$_n$), the monitor circuit 232 may generate a plurality of control signals addp0-addp2 and addp5 to perform related monitor operations. Firstly, during a time interval S0, the monitor circuit 232 may monitor the wordline WL$_n$. For example, when the control signal addp0 is at a high signal level, the monitor circuit 232 may checks if a disturbance record associated with the wordline WL$_n$ is stored in the monitor circuit 232, wherein the disturbance record indicates a disturbance count of the wordline WL$_n$ (i.e. a number of times the wordline WL$_n$ is disturbed due to activation of one or more wordlines adjacent to the wordline WL$_n$). please note that, when the wordline WL$_n$ is activated, data stored in a memory cell connected to the wordline WL$_n$ is updated and therefore undisturbed. Hence, when it is checked that the disturbance record associated with the wordline WL$_n$ is stored in the monitor circuit 232, the monitor circuit 232 may discard/delete the disturbance record associated with the wordline WL$_n$.

Additionally, the monitor circuit 232 may refer to the buffer state FS of the FIFO register 236 to check if the FIFO register 236 stores a buffer record associated with the wordline WL$_n$, wherein the buffer record indicates that the wordline WL$_n$ is a candidate wordline for refresh. In other words, the monitor circuit 232 may check if the wordline WL$_n$ has been determined as a candidate wordline for refresh. When the FIFO register 236 stores the buffer record associated with the wordline WL$_n$, the FIFO register 236 may delete the buffer record associated with the wordline WL$_n$ because data stored in a memory cell connected to the wordline WL$_n$ may be updated and therefore undisturbed due to the activation of the wordline WL$_n$, During a time interval S1, the monitor circuit 232 may monitor the wordline WL$_{n+1}$. For example, when the control signal addp1 is at a high signal level, the monitor circuit 232 may check if the wordline WL$_{n+1}$ exists (e.g. the wordline WL$_{n+1}$ may not exist when the wordline WL$_n$ is the normal wordline NWL511 shown in FIG. 3). The monitor circuit 232 may further check if the FIFO register 236 stores a buffer record associated with the wordline WL$_{n+1}$, where the buffer record indicates that the wordline WL$_{n+1}$ is a candidate wordline for refresh. In other words, the monitor circuit 232 may check if the wordline WL$_{n+1}$ has been determined as a candidate wordline for refresh before calculating the disturbance count of the wordline WL$_{n+1}$. In a case where the wordline WL$_{n+1}$ exists, after it is checked that the FIFO register 236 does not store the buffer record associated with the wordline WL$_{n+1}$, the monitor circuit 232 may calculate (or update/renew) the disturbance count of the wordline $WL_{n+1}$. For example, the monitor circuit 232 may increment the disturbance count of the wordline $WL_{n+1}$ by one. It should be noted that, before updating/renewing the disturbance count of the wordline $WL_{n+1}$, the monitor circuit 232 may further check if the disturbance count of the wordline $WL_{n+1}$ is less than a predetermined threshold (e.g. tMAC). When the disturbance count of the wordline $WL_{n+1}$ is not less than the predetermined threshold, the monitor circuit 232 may not update/renew the disturbance count of the wordline $WL_{n+1}$.

During a time interval S2, when the control signal addp2 is at a high signal level, the monitor circuit 232 may check if the disturbance count of the wordline $WL_{n+1}$ is greater than or equal to the predetermined threshold (e.g. tMAC). When determining that the disturbance count of the wordline $WL_{n+1}$ is greater than or equal to the predetermined threshold, the monitor circuit 232 may output the intermediate address $ADD_{D+1}$ as the input wordline address IN_ADD and the input identification code IN_red to the FIFO register 236. In addition, after the monitor circuit 232 outputs the intermediate address $ADD_{D+1}$ to the FIFO register 236, the monitor circuit 232 may delete the disturbance record associated with the disturbance count of the wordline $WL_{n+1}$. It should be noted that, before outputting the intermediate address $ADD_{D+1}$ to the FIFO register 236, the monitor circuit 232 may further refer to the buffer state FS to check if the FIFO register 236 has any available storage spaces. When no storage space is available in the FIFO register 236, the monitor circuit 232 may preserve the disturbance record associated with the wordline $WL_{n+1}$ until a storage space is available in the FIFO register 236. When the FIFO register 236 has an available storage space, the monitor circuit 232 may output the intermediate address $ADD_{D+1}$ and then delete the disturbance record associated with the wordline $WL_{n+1}$.

In some embodiments, when determining not to refresh the wordline $WL_{n+1}$ (e.g. the disturbance count thereof is less than the predetermined threshold), the monitor circuit 232 may further determine whether to delete the disturbance record associated with the wordline $WL_{n+1}$. In one implementation, when the calculated/updated disturbance count of the wordline $WL_{n+1}$ is less than the predetermined threshold such as tMAC, the monitor circuit 232 may refer to the disturbance count of the wordline $WL_{n+1}$ and a number of counts, which is required by the refresh counter 240 to count from refresh address pCNT to the wordline address $add\_WL_{n+1}$, to determine if the disturbance count of the wordline $WL_{n+1}$ will reach the predetermined threshold before the refresh counter 240 counts to the wordline address $add\_WL_{n+1}$. When the monitor circuit 232 determines that the disturbance count of the wordline $WL_{n+1}$ will not reach the predetermined threshold before the refresh counter 240 counts to the wordline address $add\_WL_{n+1}$, this means that the wordline $WL_{n+1}$ may have been refreshed before the disturbance count thereof reach the predetermined threshold. Hence, the monitor circuit 232 may not need to record the disturbance count of the wordline $WL_{n+1}$. Specifically, the monitor circuit 232 may delete the disturbance record associated with the disturbance count of the wordline $WL_{n+1}$.

By way of example but not limitation, consider a case where the memory device 200 has a row cycle time (tRC) of 50 ns, a refresh period (tREF) of 64 ms, a refresh interval (tREFI) of 7.8 µs and a maximum activate count (tMAC) of 300000 (300K), and a total number of rows of the memory device 200 is $2^{13}$. Based on the above memory parameters, a maximum number of wordlines ($K_M$) each having the maximum activate count (tMAC) within the refresh period is 4.3 ($K_M$=tREF/(tMAC×tRC). If the wordlines each having the maximum activate count are evenly distributed over the total rows, there may be such a wordline every L wordlines, wherein L equals to 1905 ($2^{13}$/4.3). In a case where the aforementioned predetermined threshold is the maximum activate count, the monitor circuit 232 may determine whether the following inequality (1) is satisfied:

$$QT+\Delta CT \times tREFI/tRC < tMAC \qquad (1)$$

where QT is the disturbance count of the wordline $WL_{n+1}$, and $\Delta CT$ is the number of counts required by the refresh counter 240 to count from refresh address pCNT to the wordline address $add\_WL_{n+1}$. When the inequality (1) is satisfied, this means that the wordline $WL_{n+1}$ may have been refreshed before the disturbance count thereof reaches the maximum activate count. Hence, the monitor circuit 232 may not need to record the disturbance count of the wordline $WL_{n+1}$.

In an alternative design, the monitor circuit 232 may determines whether the following inequality (2) is satisfied in order to determine if the disturbance count of the wordline $WL_{n+1}$ will reach the predetermined threshold before the refresh counter 240 counts to the wordline address $add\_WL_{n+1}$:

$$\Delta CT+QT/(tREFI/tRC) < NR/(tREF/(THD \times tRC)) \qquad (2)$$

where NR is a total number of rows of the memory device 200, and THD is the predetermined threshold. When the inequality (2) is satisfied, the monitor circuit 232 may determine that the disturbance count of the wordline $WL_{n+1}$ will not reach the predetermined threshold before the refresh counter 240 counts to the wordline address $add\_WL_{n+1}$. In a case where the predetermined threshold equals to a maximum activate count, the inequality (2) may be simplified as follows by using the above memory parameter values:

$$\Delta CT+QT/(tREFI/tRC) < 1905 \qquad (3)$$

It should be noted that tREF/(THD×tRC) in the inequality (2) may not be an integer (e.g. the aforementioned $K_M$ equals to 4.3 when the predetermined threshold equals to the maximum activate count (tMAC)). Hence, the constant on the right side of the inequality (3) may be adjusted. For example, the inequality (3) may be modified as follows:

$$\Delta CT+QT/(tREFI/tRC) < 2000 \qquad (4)$$

In brief, when the monitor circuit 232 determines that an inequality (e.g. one of the above inequalities (2)-(4)) is satisfied, this means that the wordline $WL_{n+1}$ may have been refreshed before the disturbance count thereof reaches the predetermined threshold. Hence, the monitor circuit 232 may not need to record the disturbance count of the wordline $WL_{n+1}$.

Next, during a time interval S3, when the control signal addp1 is at a high signal level, the monitor circuit 232 may monitor the wordline $WL_{n-1}$. During a time interval S4, when the control signal addp2 is at a high signal level, the monitor circuit 232 may monitor the wordline $WL_{n-1}$. As respective monitor operations performed on the wordline $WL_{n-1}$ during the time intervals S3 and S4 are identical/similar to those performed on the wordline $WL_{n+1}$ during the time intervals S1 and S2 respectively, similar description is not repeated here for brevity.

It should be noted that, each time K activate commands are issued (K is a positive integer greater than one), the monitor circuit 232 may perform a monitor operation once to check all disturbance records stored therein, wherein the monitor operation may be performed when the control signal addp5 is at a high signal level during a time interval S5. In one implementation, the monitor circuit 232 may store at least one disturbance record, and each of the at least one disturbance record is associated with a disturbance count of a wordline. For each of the at least one disturbance record, the monitor circuit 232 may determine once every K activate commands whether the disturbance count of the wordline will not reach a predetermined threshold before the refresh counter 240 counts to a wordline address indicating the wordline. In other words, the monitor circuit 232 may determine, each time K activate commands are issued, whether the disturbance count of the wordline will not reach the predetermined threshold before the refresh counter 240 counts to the wordline address indicating the wordline. When determining that the disturbance count of the wordline will not reach the predetermined threshold, the monitor circuit 232 may delete the disturbance record associated with the disturbance count of the wordline. In other words, the monitor circuit 232 may check once every K active commands whether there is any disturbance record that needs not to be recorded.

In another implementation, regarding each disturbance record stored in the monitor circuit 232, the monitor circuit 232 may determine once every K activate commands whether the disturbance record has been modified within a period of time during which the K active commands are issued. When determining that the disturbance record has not been modified within the period of time, the monitor circuit 232 may decrease the disturbance count of the wordline by a predetermined value (e.g. one).

By way of example but not limitation, the aforementioned K value may be greater than or equal to a maximum number of wordlines each having a maximum activate count (tMAC) within a refresh period (tREF), wherein the maximum number of wordlines is determined by the following expression:

$$tREF/(tMAC \times tRC).$$

In other words, K may be greater than or equal to the aforementioned $K_M$. In an alternative design, K may be determined according to actual design considerations.

Please note that, in some embodiments, the monitor circuit 232 may output the control signals addp0 and addp2 to the FIFO register 236. In a case where the FIFO register 236 stores a buffer record associated with the wordline $WL_n$, when the control signal addp0 is at a high signal level, the FIFO register 236 may delete the buffer record associated with the wordline $WL_n$, and determine if any other buffer record is stored therein. When it is determined that there is no buffer record stored in the FIFO register 236, the FIFO register 236 may set a signal level of the selection signal TRR_valid to a logic level (e.g. "0").

In another case where the monitor circuit 232 outputs the intermediate address $ADD_{D+1}$ indicating the wordline $WL_{n+1}$ (or the intermediate address $ADD_{D-1}$ indicating the wordline $WL_{n-1}$) to the FIFO register 236, when the control signal addp2 is at a high signal level, the FIFO register 236 may store a buffer record associated with the wordline $WL_{n+1}/WL_{n-1}$, and set the signal level of the selection signal TRR_valid to another logic level (e.g. "1").

According to the exemplary operations described above, the monitor circuit 232 may monitor each wordline, and/or the FIFO register 236 may store at least one buffer record associated with a candidate wordline for refresh. It should be noted that the operation timing shown in FIG. 6 is for illustrative purposes only and is not meant to be a limitation of the present invention. For example, provided that the result is substantially the same, the aforementioned wordline monitoring operations are not required to be performed according to the operation timing shown in FIG. 6.

In addition to monitoring a disturbance count of each wordline to determine wordline(s) to be refreshed, the proposed memory control mechanism may adjust an address counting sequence of a refresh counter, such that a disturbance count of a wordline adjacent to an activated wordline may not exceed a predetermined threshold (e.g. a maximum activate count) before the refresh counter counts to a wordline address of the wordline. Please refer to FIG. 7 in conjunction with FIG. 2. FIG. 7 is a diagram illustrating implementations of count bits utilized by the refresh counter 240 shown in FIG. 2 according to an embodiment of the present invention. In the embodiment shown in FIG. 7, the memory device 200 may utilize a plurality of wordline address bits $A_J$-$A_0$ for addressing, and the refresh counter 240 may utilize a plurality of count bits $C_J$-$C_0$ for wordline address counting, wherein J is a positive integer, and an order of the wordline address bits $A_J$-$A_0$ from a most significant bit (MSB) to a least significant bit (LSB) is $A_J$, $A_{J-1}$, $A_{J-2}$, ..., $A_3$, $A_2$, $A_1$, $A_0$.

Regarding an address counting sequence SQ0 (a conventional counting sequence), the count bits $C_J$-$C_0$ are directed to the wordline address bits $A_J$-$A_0$, respectively. Hence, a number of counts required by the refresh counter 240 to count from the wordline address add_$WL_{n-1}$ to the wordline address add_$WL_{n+1}$ is two. Please note that, as described above, in a case where the memory device 200 has a row cycle time (tRC) of 50 ns, a refresh period (tREF) of 64 ms, a refresh interval (tREFI) of 7.8 µs and a maximum activate count (tMAC) of 300000 (300K), and a total number of rows of the memory device 200 is $2^{13}$, there may be a wordline having the maximum activate count every L (1905) wordlines if the wordlines each having the maximum activate count are evenly distributed over the total rows of the memory device 200. Hence, when a number of counts required by the refresh counter 240 to count from the refresh address pCNT to one of the wordline address add_$WL_{n+1}$ and the wordline address add_$WL_{n-1}$ is greater than L, it is very likely that a number of counts required by the refresh counter 240 to count from the refresh address pCNT to the other of the wordline address add_$WL_{n+1}$ and the wordline address add_$WL_{n-1}$ is also greater than L. In other words, the monitor circuit 232 may have to record each of the disturbance count of the wordline $WL_{n+1}$ and the disturbance count of the wordline $WL_{n-1}$.

In order to save storage space in the monitor circuit 232, the proposed memory control mechanism may adjust a bit position of a count bit directed to a LSB of the wordline address bits $A_J$-$A_0$. Specifically, a count bit at a bit position higher than a LSB ($A_1$) of the count bits $C_J$-$C_0$ may be directed to a second LSB of wordline address bits $A_J$-$A_0$ of the memory device 200. For example, regarding an address counting sequence SQ1, the count bits $C_J$-$C_0$ are directed to the wordline address bits $A_J$-$A_0$ in a reverse order. In other words, the count bit $C_{J-1}$ is directed to the wordline address bit $A_1$. Hence, a number of counts required by the refresh counter 240 to count from the wordline address add_$WL_{n-1}$ to the wordline address add_$WL_{n+1}$ is $2^{J-1}$. In a case where a total number of rows of the memory device 200 is $2^{13}$ (J=12), the refresh counter 240 may require $2^{11}$ (2K) counts to count from the wordline address add_$WL_{n-1}$ to the wordline address add_$WL_{n+1}$. In other words, a number of counts required by the refresh counter 240 to count from the refresh address pCNT to one of the wordline addresses add_$WL_{n+1}$ and add_$WL_{n-1}$ may be much less than a number of counts required by the refresh counter 240 to count from the refresh address pCNT to the other of the wordline addresses add_$WL_{n+1}$ and add_$WL_{n-1}$. This means that a disturbance count of one of the wordline addresses add_$WL_{n+1}$ and add_$WL_{n-1}$ is likely not to exceed a predetermined threshold (e.g. a maximum activate count) before the refresh counter 240 counts to said one of the wordline addresses add_$WL_{n+1}$ and add_$WL_{n-1}$. Accordingly, the monitor circuit 232 may not need to record the disturbance count of one of the wordlines $WL_{n+1}$ and $WL_{n-1}$.

In another example (an address counting sequence SQ2), the count bits $C_J$, $C_{J-1}$, $C_{J-2}$, ..., $C_3$, $C_2$, $C_1$, $C_0$ may be directed to the wordline address bits $A_1$, $A_0$, $A_2$, ..., $A_{J-3}$, $A_{J-2}$, $A_{J-1}$, $A_J$, wherein the count bit $C_J$ is directed to the wordline address bit $A_1$. Hence, a number of counts required by the refresh counter 240 to count from the wordline address add_$WL_{n-1}$ to the wordline address add_$WL_{n+1}$ is $2^J$ ($2^{12}$ or 4K when J=12). In yet another example (an address counting sequence SQ3), the count bits $C_J$, $C_{J-1}$, $C_{J-2}$, ..., $C_3$, $C_2$, $C_1$, $C_0$ may be directed to the wordline address bits $A_2$, $A_0$, $A_1$, ..., $A_{J-3}$, $A_{J-2}$, $A_{J-1}$, $A_J$, wherein the count bit $C_{J-2}$ is directed to the wordline address bit $A_1$. Hence, a number of counts required by the refresh counter 240 to count from the wordline address add_$WL_{n-1}$ to the wordline address add_$WL_{n+1}$ is $2^{J-2}$ ($2^{10}$ or 1K when J=12). In brief, when a count bit at a bit position higher than the LSB of the count bits $C_J$-$C_0$ is directed to the second LSB of wordline address bits $A_J$-$A_0$ of the memory device 200, a number of counts required by the refresh counter 240 to count from one of the wordline addresses add_$WL_{n+1}$ and add_$WL_{n+1}$ to the other of the wordline addresses add_$WL_{n+1}$ and add_$WL_{n+1}$ is increased (greater than two), thus reducing the likelihood that a disturbance count of a wordline exceeds a predetermined threshold before the refresh counter 240 counts to a wordline address of the wordline.

To sum up, by monitoring memory rows disturbed by activation of adjacent rows and rearranging a count sequence of a refresh counter, the proposed memory control mechanism may effectively maintain data integrity without entering a conventional target row refresh mode, thus reducing the cost and complexity of the memory circuitry. Additionally, by utilizing an identification code indicating a wordline type, the proposed memory control mechanism may be applicable to activation/refresh of a normal wordline, a redundant wordline, a boundary wordline and a non-boundary wordline.

Furthermore, please note that the above is for illustrative purposes only and is not meant to be a limitation of the present invention. For example, an identification code of an intermediate address is not limited to be a single bit. In another example, the FIFO register 236 shown in FIG. 2 may be implemented by other types of storage circuits/devices. In yet another example, it is possible to utilize other circuit elements to implement the architecture of the refresh control circuit 230 shown in FIG. 2. In other words, as long as a refresh control circuit (e.g. the refresh control circuit 130 shown in FIG. 1) may perform the operations associated with the monitor circuit 232, the FIFO register 236 and/or the selection circuit 238, various modifications and alternatives fall within the scope of the prevent invention.

Figure 8:
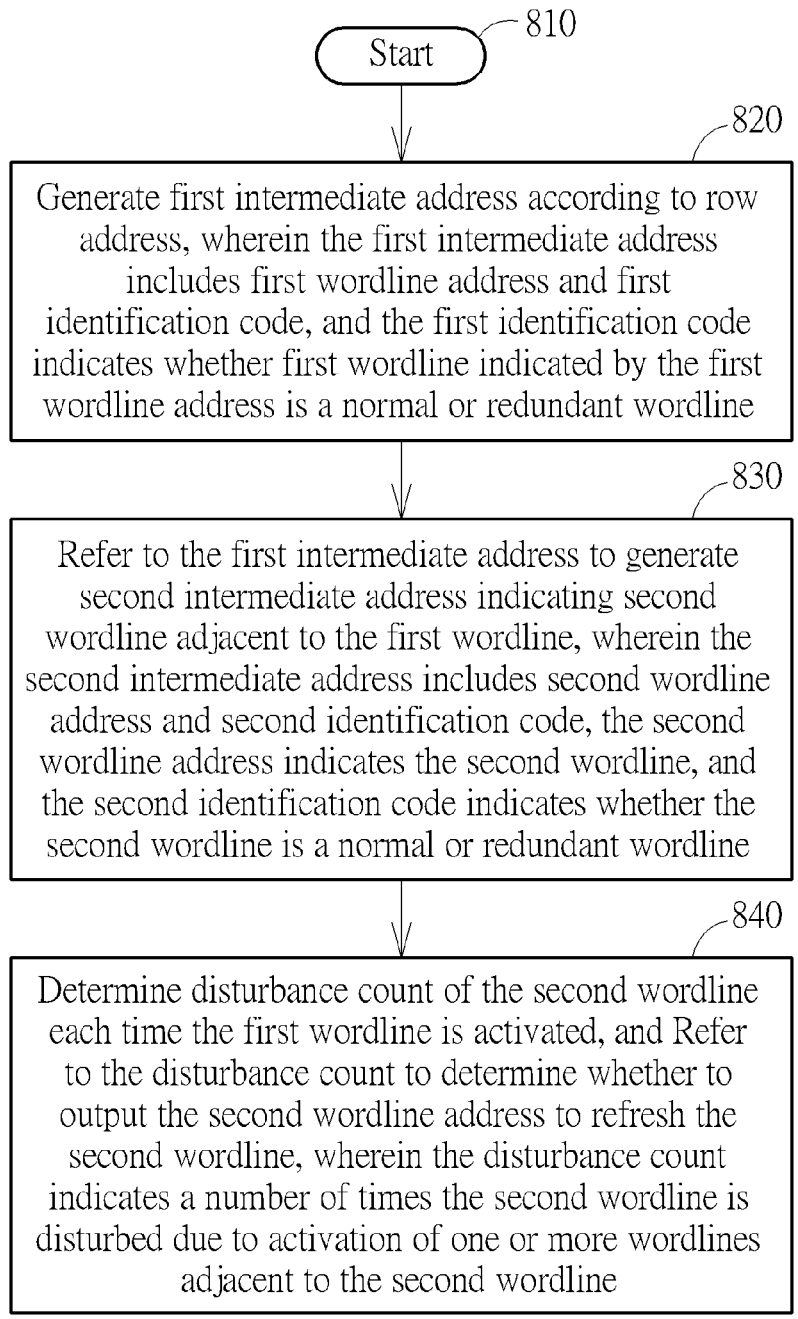
FIG. 8 is a flow chart of an exemplary control method of a memory device according to an embodiment of the present invention.

The proposed memory control mechanism may be summarized in FIG. 8. FIG. 8 is a flow chart of an exemplary control method of a memory device according to an embodiment of the present invention. For illustrative purposes, the control method shown in FIG. 8 is described with reference to the memory device 100 shown in FIG. 1. This is not meant to be a limitation of the present invention. For example, the method shown in FIG. 8 may be employed in the electronic device 200 shown in FIG. 2. The control method shown in FIG. 8 may be summarized below.

Step 810: Start.

Step 820: Generate the intermediate address $ADD_D$ according to the row address ADDX, wherein the intermediate address $ADD_D$ includes the wordline address add_$WL_n$ and the identification code red_$WL_n$, and the identification code red_$WL_n$ indicates whether the wordline $WL_n$ indicated by the wordline address add_$WL_n$ is a normal wordline or a redundant wordline.

Step 830: Refer to the intermediate address $ADD_D$ to generate the intermediate address $ADD_{D+1}$ (or the intermediate address $ADD_{D-1}$) indicating the wordline $WL_{n+1}$ adjacent to the wordline $WL_n$, wherein the intermediate address $ADD_{D+1}$ includes the wordline address add_$WL_{n+1}$ and the identification code red_$WL_{n+1}$, the wordline address add_$WL_{n+1}$ indicates the wordline $WL_{n+1}$, and the identification code red_$WL_{n+1}$ indicates whether the wordline $WL_{n+1}$ is a normal wordline or a redundant wordline.

Step 840: Determine a disturbance count of the wordline $WL_{n+1}$ each time the wordline $WL_n$ is activated, and Refer to the disturbance count to determine whether to output the wordline address add_$WL_{n+1}$ to refresh the wordline $WL_{n+1}$, wherein the disturbance count indicates a number of times the wordline $WL_{n+1}$ is disturbed due to activation of one or more wordlines adjacent to the wordline $WL_{n+1}$.

The above is for illustrative purposes only and is not meant to be a limitation of the present invention. Provided that the result is substantially the same, the steps are not required to be executed in the exact order shown in FIG. 8. Other steps or intermediate steps can be added. Bay way of example but not limitation, in some embodiments, the proposed control method may provide the refresh address pCNT. When it is determined to output the wordline address add_$WL_{n+1}$/add_$WL_{n-1}$ to refresh the wordline $WL_{n+1}$/$WL_{n-1}$, the proposed control method may output the wordline address add_$WL_{n+1}$/add_$WL_{n-1}$ before outputting the refresh address pCNT such that the wordline $WL_{n+1}$/$WL_{n-1}$ is refreshed before a predetermined wordline indicated by the refresh address pCNT is refreshed. In another example, step 840 may include the operations of the refresh control circuit 230 shown in FIG. 2. As a person skilled in the art should understand the operation of each step shown in FIG. 8 after reading the above paragraphs directed to FIGS. 1-7, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a plurality of normal wordlines;
   a plurality of redundant wordlines;
   an address generation circuit, for generating a first intermediate address according to a row address, wherein the first intermediate address comprises a first wordline address and a first identification code, and the first identification code indicates whether a first wordline indicated by the first wordline address is a normal wordline or a redundant wordline;
   an address processing circuit, coupled to the address generation circuit, the address processing circuit arranged for referring to the first intermediate address to generate a second intermediate address indicating a second wordline adjacent to the first wordline, wherein the second intermediate address comprises a second wordline address and a second identification code, the second wordline address indicates the second wordline, and the second identification code indicates whether the second wordline is a normal wordline or a redundant wordline; and a refresh control circuit, coupled to the address processing circuit, the refresh control circuit arranged for determining a disturbance count of the second wordline each time the first wordline is activated, and referring to the disturbance count to determine whether to output the second wordline address to refresh the second wordline, wherein the disturbance count indicates a number of times the second wordline is disturbed due to activation of one or more wordlines adjacent to the second wordline.

2. The memory device of claim 1, wherein when the disturbance count is greater than or equal to a predetermined threshold, the refresh control circuit determines to output the second wordline address to refresh the second wordline.

3. The memory device of claim 1, wherein the refresh control circuit checks if a disturbance record associated with the first wordline is stored in the refresh control circuit; the disturbance record indicates a disturbance count of the first wordline; and when the refresh control circuit stores the disturbance record associated with the first wordline, the refresh control circuit deletes the disturbance record associated with the first wordline.

4. The memory device of claim 1, wherein the refresh control circuit stores at least one disturbance record, and each of the at least one disturbance record is associated with a disturbance count of a wordline; for said each disturbance record, the refresh control circuit determines once every K activate commands whether said disturbance record has been modified within a period of time during which the K active commands are issued, and K is a positive integer greater than one; and when determining that said disturbance record has not been modified within the period of time, the refresh control circuit decreases the disturbance count of the wordline by a predetermined value.

5. The memory device of claim 4, wherein K is greater than or equal to a maximum number of wordlines each having a maximum activate count within a refresh period; and the maximum number of wordlines is determined by the following expression:

$$tREF/(tMAC \times tRC);$$

wherein tREF is the refresh period, tMAC is the maximum activate count, and tRC is a row cycle time.

6. The memory device of claim 1, wherein the row address indicates one of the normal wordlines, and the address generation circuit further determines whether said one of the normal wordlines is defective; when said one of the normal wordlines is not defective, the address generation circuit uses the row address as the first wordline address, and the first wordline is said one of the normal wordlines; and when said one of the normal wordlines is defective, the address generation circuit uses a redundant wordline address indicating one of the redundant wordlines as the first wordline address.

7. The memory device of claim 1, further comprising:
a refresh counter, coupled to the refresh control circuit, the refresh counter arranged for providing a refresh address for the refresh control circuit, wherein when determining to output the second wordline address to refresh the second wordline, the refresh control circuit outputs the second wordline address before outputting the refresh address such that the second wordline is refreshed before a predetermined wordline indicated by the refresh address is refreshed.

8. The memory device of claim 7, wherein when determining to output the second wordline address to refresh the second wordline, the refresh control circuit outputs the second wordline address in response to a refresh command, and the refresh counter outputs the second identification code in response to the refresh command.

9. The memory device of claim 7, wherein when determining not to output the second wordline address, the refresh control circuit outputs the refresh address in response to a refresh command, and the refresh counter outputs a third identification code in response to the refresh command; and the third identification code indicates whether a wordline indicated by the refresh address is a normal wordline or a redundant wordline.

10. The memory device of claim 7, wherein the refresh counter requires a number of counts to count from the refresh address to the second wordline address; when the refresh control circuit determines not to refresh the second wordline, the refresh control circuit refers to the disturbance count and the number of counts to determine if the disturbance count will reach a predetermined threshold before the refresh counter counts to the second wordline address; and when the refresh control circuit determines that the disturbance count will not reach the predetermined threshold before the refresh counter counts to the second wordline address, the refresh control circuit deletes a disturbance record associated with the disturbance count of the second wordline.

11. The memory device of claim 10, wherein the refresh control circuit determines whether an inequality is satisfied in order to determine if the disturbance count will reach the predetermined threshold before the refresh counter counts to the second wordline address; and the inequality is:

$$\Delta CT + QT/(tREFI/tRC) < NR/(tREF/(THD \times tRC));$$

wherein $\Delta CT$ is the number of counts required by the refresh counter to count from the refresh address to the second wordline address, QT is the disturbance count, tREFI is a refresh interval, tRC is a row cycle time, NR is a total number of rows of the memory device, tREF is a refresh period and THD is the predetermined threshold; and when the inequality is satisfied, the refresh control circuit determines that the disturbance count will not reach the predetermined threshold before the refresh counter counts to the second wordline address.

12. The memory device of claim 7, wherein the refresh control circuit stores at least one disturbance record, and each of the at least one disturbance record is associated with a disturbance count of a wordline; for said each disturbance record, the refresh control circuit determines once every K activate commands whether the disturbance count of the wordline will not reach a predetermined threshold before the refresh counter counts to a wordline address indicating the wordline, and K is a positive integer greater than one; and when the refresh control circuit determines that the disturbance count of the wordline will not reach the predetermined threshold, the refresh control circuit deletes said disturbance record associated with the disturbance count of the wordline.

13. The memory device of claim 12, wherein K is greater than or equal to a maximum number of wordlines each having a maximum activate count within a refresh period; and the maximum number of wordlines is determined by the following expression:

$$tREF/(tMAC \times tRC);$$

wherein tREF is the refresh period, tMAC is the maximum activate count, and tRC is a row cycle time.

14. The memory device of claim 7, wherein the refresh counter utilizes a plurality of count bits for wordline address counting, and a count bit at a bit position higher than a second least significant bit (LSB) of the count bits is directed to a second LSB of wordline address bits of the memory device.

15. The memory device of claim 7, wherein the refresh control circuit comprises:
   a selection circuit, coupled to the refresh counter, the selection circuit arranged for outputting one of the second wordline address and the refresh address according to a selection signal;
   a monitor circuit, coupled to the selection circuit, the monitor circuit arranged for calculating the disturbance count of the second wordline each time the first wordline is activated, and referring to the disturbance count to determine whether to refresh the second wordline, wherein when the disturbance count is greater than or equal to a predetermined threshold, the monitor control circuit outputs the second intermediate address so as to refresh the second wordline; and
   a storage circuit, coupled to the selection circuit and the monitor circuit, wherein when the storage circuit stores the second intermediate address outputted from the monitor circuit, the storage circuit generates the selection signal to enable the selection circuit to output the second wordline address; and when the storage circuit does not store the second intermediate address, the storage circuit generates the selection signal to enable the selection circuit to output the refresh address.

16. The memory device of claim 15, wherein after the monitor circuit outputs the second intermediate address to the storage circuit, the monitor circuit deletes a disturbance record associated with the disturbance count of the second wordline.

17. The memory device of claim 15, wherein the storage circuit further checks if the storage circuit stores a buffer record associated with the first wordline, and the buffer record indicates that the first wordline is a candidate wordline for refresh; and when the storage circuit stores the buffer record associated with the first wordline, the storage circuit deletes the buffer record associated with the first wordline.

18. The memory device of claim 15, wherein before calculating the disturbance count of the second wordline, the monitor circuit checks if the storage circuit stores a buffer record associated with the second wordline, where the buffer record indicates that the second wordline is a candidate wordline for refresh; and after it is checked that the storage circuit does not store the buffer record associated with the second wordline, the monitor circuit calculates the disturbance count of the second wordline.

19. The memory device of claim 15, wherein the storage circuit is a first-in first-out register.

20. A control method of a memory device, the memory device comprising a plurality of normal wordlines and a plurality of redundant wordlines, the control method comprising:
   generating a first intermediate address according to a row address, wherein the first intermediate address comprises a first wordline address and a first identification code, and the first identification code indicates whether a first wordline indicated by the first wordline address is a normal wordline or a redundant wordline;
   referring to the first intermediate address to generate a second intermediate address indicating a second wordline adjacent to the first wordline, wherein the second intermediate address comprises a second wordline address and a second identification code, the second wordline address indicates the second wordline, and the second identification code indicates whether the second wordline is a normal wordline or a redundant wordline; and
   determining a disturbance count of the second wordline each time the first wordline is activated, and referring to the disturbance count to determine whether to output the second wordline address to refresh the second wordline, wherein the disturbance count indicates a number of times the second wordline is disturbed due to activation of one or more wordlines adjacent to the second wordline.

21. The control method of claim 20, further comprising:
   providing a refresh address; and
   when it is determined to output the second wordline address to refresh the second wordline, outputting the second wordline address before outputting the refresh address such that the second wordline is refreshed before a predetermined wordline indicated by the refresh address is refreshed.

* * * * *